United States Patent [19]

Pontius et al.

[11] Patent Number: 5,606,269
[45] Date of Patent: Feb. 25, 1997

[54] NON-DELAY BASED ADDRESS TRANSITION DETECTOR (ATD)

[75] Inventors: Dale E. Pontius, Colchester; Robert Tamlyn, Jerico, both of Vt.

[73] Assignee: International Business Machines Corporation, Armonk, N.Y.

[21] Appl. No.: 548,651

[22] Filed: Oct. 26, 1995

[51] Int. Cl.⁶ .............................................. H03K 19/003
[52] U.S. Cl. ........................... 326/93; 326/21; 365/233.5
[58] Field of Search .................................. 326/21, 93, 98; 327/18, 20; 365/233.5

[56] References Cited

U.S. PATENT DOCUMENTS

| | | |
|---|---|---|
| 4,730,131 | 3/1988 | Sauer . |
| 4,800,295 | 1/1989 | Minuhin et al. . |
| 4,843,596 | 6/1989 | Miyatake et al. . |
| 4,980,577 | 12/1990 | Baxter . |
| 5,057,712 | 10/1991 | Trinh et al. . |
| 5,198,709 | 3/1993 | O'Connell . |
| 5,306,963 | 4/1994 | Leak et al. . |
| 5,465,062 | 11/1995 | Fong ........................................ 327/172 |
| 5,493,538 | 2/1996 | Bergman .............................. 365/233.5 |
| 5,519,666 | 5/1996 | McAdams ............................ 365/233.5 |
| 5,548,560 | 8/1996 | Stephens, Jr. et al. .............. 365/233.5 |

*Primary Examiner*—David R. Hudspeth
*Attorney, Agent, or Firm*—Whitman, Curtis, Whitham & McGinn; Howard J. Walter, Esq.

[57] ABSTRACT

A circuit for detecting an input signal, the circuit having an input node and an output node, includes a first latch having a set input coupled to the input node, for detecting falling transitions at the input node. A second latch having a set input coupled to the input node, detects rising transitions at the input node. A first logic device, responsive to outputs of the first and second latches, detects that an input signal has been received at both the first and second latches. A second logic device, responsive to a complement output of both the first and second latches, resets both the first and second latches.

20 Claims, 3 Drawing Sheets

NON-DELAY BASED ADDRESS TRANSITION DETECTOR (ATD)

BACKGROUND OF THE INVENTION

1. Field of the Invention

The present invention generally relates to a circuit which is immune to noise, and more particularly to an address transition detector (ATD) which includes two reset-set (RS) flip-flops for comparing a latched prior state to a new state, and included in a self-timed reset from a data output to produce an output pulse.

2. Description of the Related Art

Address transition detectors are well-known and are commonly used, for example, in static random access memories (SRAM) and erasable programmable read-only memories (EPROM). ATDs are useful for increasing the speed with which data can be read from the memory. This is accomplished by performing operations which are required for every memory read operation as soon as an address transition has been detected.

These operations include equalizing sense amplifiers and latching the previous output. The sense amplifiers are for amplifying the relatively weak signals sensed from the memory cells to be read during the read operation. Equalizing the sense amplifiers causes the amplifiers to be cleared or otherwise set up so that they are ready to process the new data to be read. Latching the previous output causes the output to stay static until the new data read from the read operation has been output from the sense amplifiers. The previous output is latched because the output of the sense amplifiers fluctuates before it finally reaches a relatively steady value. Latching the previous output ensures that the fluctuations do not pass down to the outputs.

The circuitry to equalize the sense amplifiers and latch previous outputs is well-known. Both operations are normally conducted during a memory read operation. The address transition detection circuitry permits these operations to be performed earlier than would be the case if an address transition detector was not employed. However, noise on the address lines may cause an ATD scheme to fail by beginning a read operation on an improper address.

Thus, in an attempt to solve such a problem, conventional ATDs typically employ delay elements, detect a change of a first and a second input signal, and are based on comparing a current address with a delayed address. The conventional ATD depends on comparing a new address with an address delayed through some circuitry. The circuitry may include an inverter chain and sometimes it simply depends on the natural delay of components that form a portion of the address path.

With such a structure, address inputs having "noise" (e.g., "noisy" address inputs) therewith cause difficulties with delay chains, resulting in erroneous ATD outputs. Specifically, delay paths are susceptible to noise when subjected to pulse widths narrower than the delay path itself. This is a problem. While conventional ATDs have attempted to solve such a problem by utilizing low-pass filters (LPFs) in an attempt to produce output pulses free of noise, such a structure is disadvantageous since such LPFs are relatively difficult to construct and such LPFs take up valuable real estate in the circuit.

ATD circuits based on a delay chain for an "old address" also may have problems if the address input is a pulse that is too short. With a short pulse, by the time the beginning of the pulse makes it through the delay chain the input may have already changed back to the original state, causing either no apparent transition or a shortened transition detect signal.

SUMMARY OF THE INVENTION

In view of the foregoing problems of the conventional systems, it is therefore an object of the present invention to provide a circuit which is immune to noise.

Another object is to provide an address transition detector (ATD) which is immune to noise.

Yet another object is to provide an ATD design which either completely ignores address input noise or generates a complete ATD output.

A further object is to provide an ATD which includes two R-S flip-flops (e.g., preferably one flip-flop latching "0" data and the other flip-flop latching "1" data) for comparing a latched prior state to a new state and included in a self-timed reset from data output to produce an output pulse.

In a first aspect of the present invention, a circuit is provided for detecting an input signal, the circuit having an input node and an output node. The circuit includes a first R-S latch having its set input coupled to the input node, detects falling transitions at the input node. A second R-S latch having its set input coupled to the input node, detects rising transitions at the input node. A first logic device responsive to the true output of both the first and second R-S latches, detects that an input signal has been received at both the first and second R-S latches. A second logic device responsive to the complement output of both the first and second R-S latches, resets both the first and second R-S latches.

With the inventive strucutre, a circuit is provided (e.g., an address transition detector (ATD)), which has better immunity to noise as compared to the conventional circuits, and which includes two R-S flip-flops for comparing latched prior state to a new state and included in a self-timed reset from data output to product an output pulse.

Moreover, a consistent detection can be obtained even when an address transition exceeds the latch threshold. The ATD pulse width is determined by the reset feedback path delay.

Further, the circuit according to the invention has inherently higher bandwidth than the conventional circuit. Further, less filtering (and subsequent delay) is needed to achieve reliable operation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
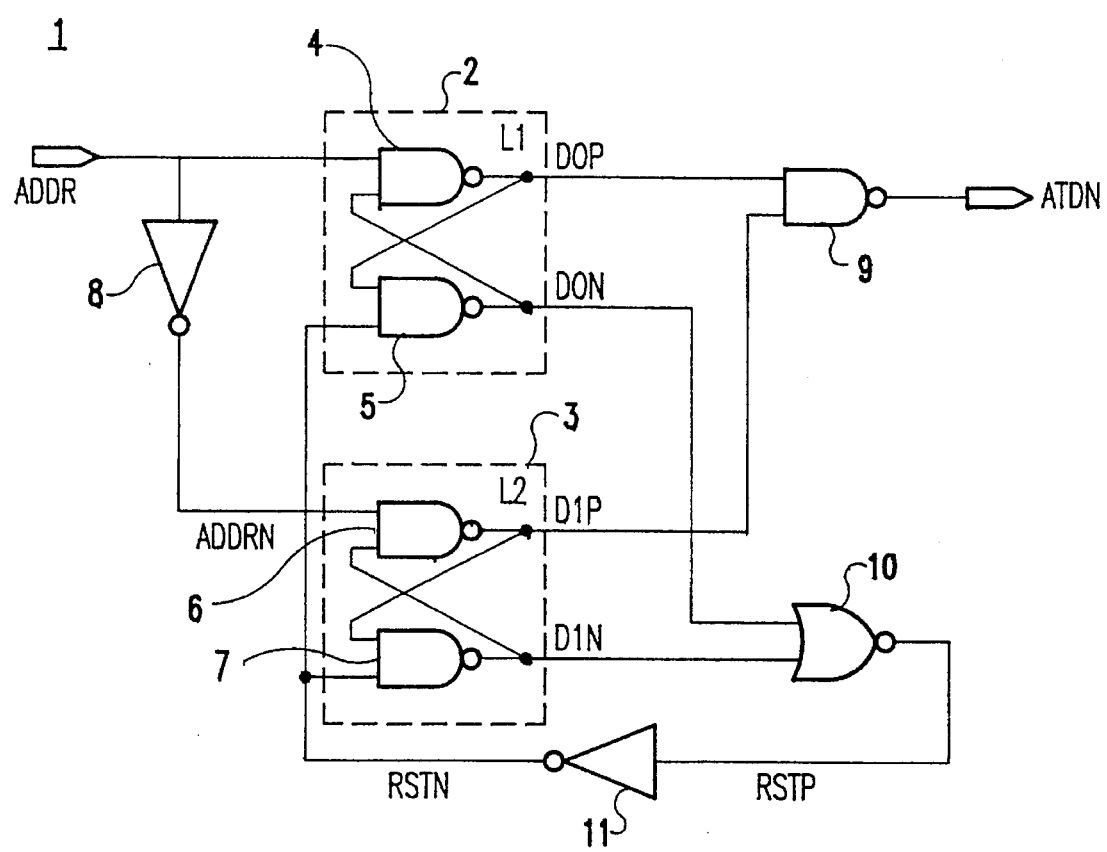
FIG. 1 is a block diagram of the circuit according to the present invention.

Referring now to the drawings, and more particularly to FIG. 1, there is shown a circuit according to a first embodiment of the present invention.

More specifically, FIG. 1 illustrates an address transition detector (ATD) 1 according to the present invention which includes a plurality of R-S flip-flops having noise filtering capability provided by the R-S flip-flop threshold, and reset circuitry. In the exemplary embodiment, first and second latches 2, 3 are provided.

The first latch 2 is for detecting, for example, a high-to-low transition of an input signal, whereas the second latch 3 is for detecting, for example, a low-to-high transition of the input signal. The output signal is a pulse preferably having a pulse width of 1–2 nS, and the reset signal is generated from the output side of the latch.

Latch 2 preferably includes first and second NAND gates 4, 5. An output of each NAND gate 4, 5 is input to the other of the NAND gates. NAND gate 4 also receives an address (ADDR) input signal. The ADDR input signal typically has 10 bits, but may include any number depending upon the designer's requirements and constraints.

Similarly to the first latch 2, the second latch 3 preferably includes first and second NAND gates 6, 7. An output of each NAND gate 6, 7 is input to the other of the NAND gates. NAND gate 6 also receives an address (ADDRN) input signal which has been inverted by inverter (e.g., NOT gate) 8.

An output D0P of the first NAND gate 4 is input to NAND gate 9. As mentioned above, the output D0P is also provided to the input of the second latch 5. NAND gate 9 also receives an output D1P from NAND gate 6 of Latch 3. NAND gate 9 performs a NAND logic operation (e.g., NANDs) on both of inputs D0N and D1P, to output an address transition detection pulse (ATDN) which is free of noise. The address detection pulse may have a pulse width of approximately 1–2 nS. NAND gates 4, 5, 6, 7, and 9 each comprise a type of circuitry well-known in the art.

An output D1N is also output from the second NAND gate 7 of the first latch 2 and is input to a NOR gate 10. NOR gate 10 also receives an input D0N from the second NAND gate 5 of the first latch 2. The NOR gate 10 performs a NOR logic operation on the inputs D0N and D1N and outputs a RSTP (reset) signal to a NOT gate (inverter) 11.

As is known, a NOR gate has two inputs and a single output, with the output of a the NOR gate being low ("0") so long as both inputs to the NOR gate are not low. IF both inputs to the NOR gate are low, then the output of the NOR gate will be high (e.g., "1"). Further, inverters are well known circuits and for brevity are not described in detail herein.

NOT gate (inverter) 11 inverts the RSTP signal and issues a RSTN signal to an input of the NAND gate 7 and to an input of NAND gate 5.

Looking at FIG. 1 and FIG. 2 which illustrates a waveform timing diagram showing waveforms at the respective terminals of the inventive structure according to FIG. 1, the operation of the inventive circuit is discussed below.

First, an address ADDR to be read from a memory is input over an address signal line. It is assumed that at some time RSTN (e.g., issued by inverter 11) pulsed "low" (e.g., a logical "0") and is now "high" (e.g., a logical "1").

Figure 2:
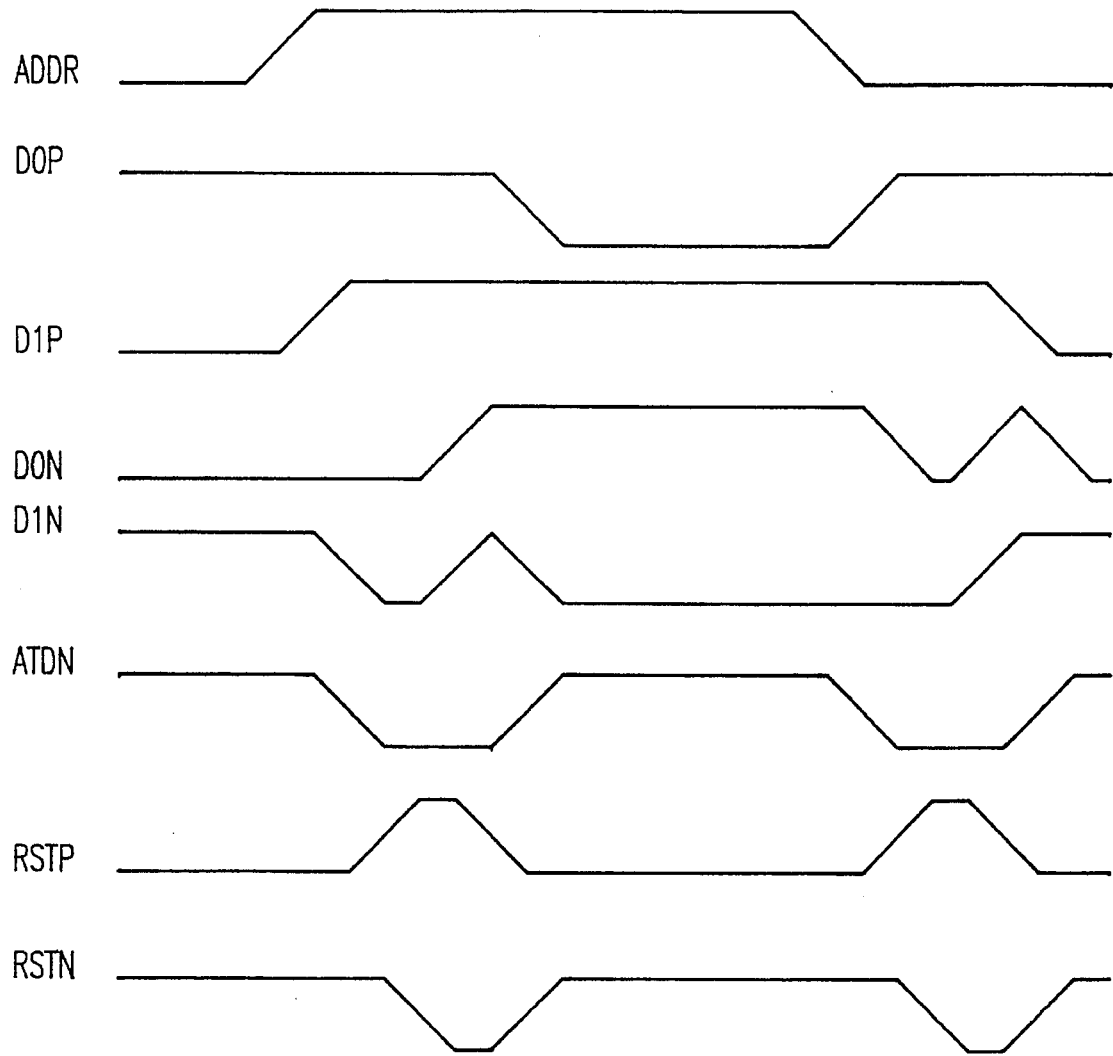
FIG. 2 illustrates a waveform timing diagram showing waveforms at the respective terminals of the inventive structure according to FIG. 1.

Now assuming that ADDR is low, D0P issued by NAND gate 4 will be high and D0N issued by NAND gate 5 will be low, while D1P issued by NAND gate 6 is low and D1N issued by NAND gate 7 is high, as shown in FIG. 2.

As a result, ATDN issued by NAND gate 9 will be high and RSTP issued by NOR gate 10 will be low, keeping RSTN issued by NOT gate 11 high, as also shown by the waveform timing diagram of FIG. 2.

Now, if ADDR goes high, ADDRN falls, causing D1P issued by NAND gate 6 to rise. Simultaneously, D0P and D0N have not changed, thereby retaining their earlier data. As shown in FIG. 2, when both D0P and D1P are high, ATDN falls, indicating an address transition.

Additionally, at the same time D1N issued by NAND gate 7 will fall. Thus, since D0N and D1N are both low, RSTP issued by NOR gate 10 will rise and RSTN issued by NOT gate 11 will fall.

When RSTN falls, both of latches 2, 3 will be reset, causing D0P issued by NAND gate 4 to fall and both D0N and D1N to rise. With both D0N and D1N rising, RSTP is caused to fall and RSTN is caused to rise.

Therefore, the reset is self-timed. D1P issued by NAND gate 6 remains high throughout the reset because it is directly controlled by ADDRN at this time. D0N issued by NAND gate 5 rises during the reset, but falls when RSTN rises. The circuit is now ready for another transition.

In the event that the address input is "noisy", the circuit is always ready to find that the ADDR and ADDRN have both been low, and thus, it is always ready to indicate an address detection transition (ATD).

Simultaneously, the reset path is tied to the latches being fully set, so that the circuit will not "forget" that it is in an address transition until it has responded to one. The advantages of such a structure is that "noise" in the address input signal is effectively filtered and a consistent detection can be obtained even when the address transition exceeds the latch threshold. Additionally, no discrete delay elements are needed and failure will be unlikely even in the event of narrow input pulses (e.g., on the order of 1.5 nS).

Further advantages of the inventive structure include that the inventive circuit produces a short, sharp output suitable for stretching to the desired width by subsequent circuitry. The inventive circuit also can resolve both leading and trailing edges of very brief input "spikes", guaranteeing that access will be determined by the trailing edge in such circumstances. The ability to resolve such situations means that less "fat" (e.g., compensation) needs to be added to cover them, otherwise.

As clearly shown in FIG. 1 and as is clear from the above, there are no delay elements required by the circuit according to the present invention. This is advantageous for saving valuable space.

Thus, the inventive circuit for detecting an input signal includes a first R-S latch having its set input coupled to the input node, which detects falling transitions at the input node. A second R-S latch having its set input coupled to the input node, detects rising transitions at the input node. A first logic device responsive to the true output of both the first and second R-S latches, detects that an input signal has been received at both the first and second R-S latches. A second logic device responsive to the complement output of both the first and second R-S latches, resets both the first and second R-S latches. With the inventive strucutre, a circuit is provided (e.g., an address transition detector (ATD)), which has better immunity to noise as compared to the conventional circuits, and which includes two R-S flip-flops for comparing latched prior state to a new state and included in a self-timed reset from data output to product an output pulse.

Moreover, when the address transition exceeds the latch threshold, a consistent detection can still be obtained. Further, the ATD pulse width is determined by the reset feedback path delay.

Thus, the circuit of the present invention provides an address transition detection circuit employing a latched input and a latched, self-timed reset. In an exemplary embodiment, the circuit utilizes, for example, 28 field-effect transistors in a complementary metal-oxide semiconductor (CMOS) structure.

Figure 3:
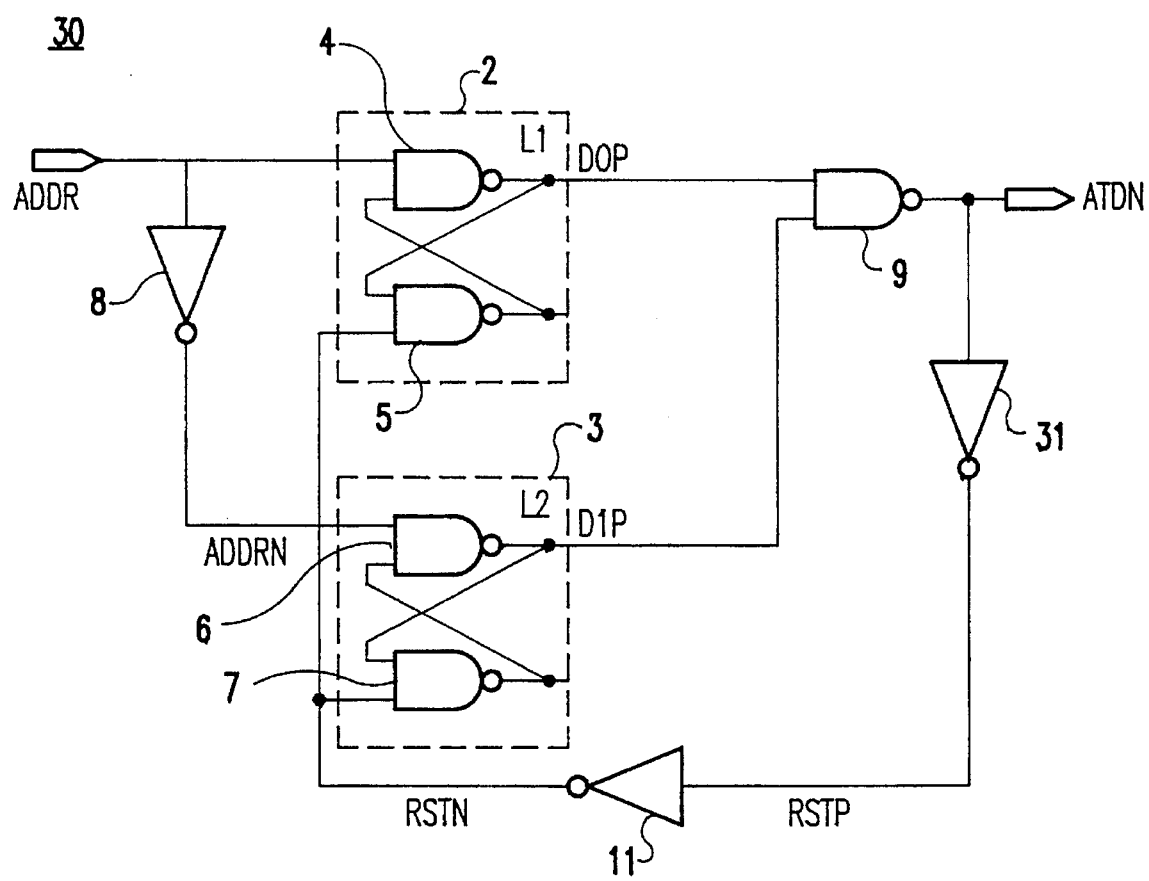
FIG. 3 illustrates a second embodiment of the present invention.

In a second embodiment of the invention, as shown in FIG. 3, a circuit 30 is provided which is similar in structure and operation to those of the first embodiment.

However, an inverter (e.g., a NOT gate) 31 is coupled between an output of NAND gate 9 and an input of inverter 11. Further in contrast to the first embodiment, a NOR gate 10 is not provided in the second embodiment.

Thus, the output of NAND gate 5 of the first latch 2 is simply input to NAND gate 4. Additionally, the output of NAND gate 7 of the second latch 3 is simply input to an input terminal of NAND gate 6. Thus, only D0P and D1P signals are generated by the first and second latches.

With this embodiment, an address transition detector is provided which has better immunity to noise as compared to the conventional circuits, and which includes two R-S flip-flops for comparing latched prior state to a new state and included in a self-timed reset from data output to product an output pulse. A consistent detection can be obtained even when an address transition exceeds the latch threshold, and the ATD pulse width is determined by the reset feedback path delay.

Moreover, while the advantages of the invention can still be accomplished, in the second embodiment a simpler and more easily manufacturable structure results as compared to the first embodiment.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A circuit for detecting an input signal, the circuit having an input node and an output node, comprising:

a first latch having a set input coupled to the input node, for detecting falling transitions at the input node;

a second latch having a set input coupled to the input node, for detecting rising transitions at the input node;

a first logic device, responsive to outputs of the first and second latches, for detecting that an input signal has been received at both the first and second latches; and a second logic device, responsive to a complement output of both the first and second latches, for resetting both the first and second latches.

2. A circuit according to claim 1, wherein said first latch comprises first and second NAND gates, each of said first and second NAND gates of said first latch receiving an output from the other of said first and second NAND gates.

3. A circuit according to claim 2, wherein said second latch comprises third and fourth NAND gates, each of said third and fourth NAND gates of said second latch receiving an output from the other of said third and fourth NAND gates.

4. A circuit according to claim 3, wherein said second logic device comprises a NOR gate for receiving an output from said second NAND gate of said first latch and an output from said fourth NAND gate of said second latch.

5. A circuit according to claim 4, wherein said second logic device further comprises an inverter for receiving an output from said NOR gate and for inverting said output to produce an inverted output, said inverted output being input to said fourth NAND gate and to said second NAND gate.

6. A circuit according to claim 5, wherein said first logic device comprises a fifth NAND gate for receiving an output from said third NAND gate and an output from said first NAND gate and for issuing an output pulse.

7. A circuit according to claim 6, further comprising an inverter for receiving said input signal and inverting said input signal to produce an inverted input signal, said inverted input signal being provided to said third NAND gate.

8. A circuit according to claim 1, wherein said second logic device includes means for resetting said first and second latches, said means for resetting comprising means for issuing a self-timed reset signal from an output side of said first and second latches.

9. An address transition circuit for detecting an input signal, the circuit having first and second nodes, comprising:

a first R-S latch having its set input coupled to the first node, for detecting first transitions at the first node;

a second R-S latch having its set input coupled to the first node, for detecting second transitions at the first node;

a first logic device, responsive to a true output of both the first and second R-S latches, for detecting that an input signal has been received at both the first and second R-S latches; and a second logic device, responsive to the complement output of both the first and second R-S latches, for resetting both the first and second R-S latches.

10. A circuit according to claim 9, wherein said first node comprises an input node and said second node comprises an output node.

11. A circuit according to claim 10, wherein said first latch comprises first and second NAND gates, each of said first and second NAND gates of said first latch receiving an output from the other of said first and second NAND gates.

12. A circuit according to claim 11, wherein said second latch comprises third and fourth NAND gates, each of said third and fourth NAND gates of said second latch receiving an output from the other of said third and fourth NAND gates.

13. A circuit according to claim 12, wherein said second logic device comprises a NOR gate for receiving an output from said second NAND gate of said first latch and an output from said fourth NAND gate of said second latch.

14. A circuit according to claim 13, wherein said second logic device further comprises an inverter for receiving an output from said NOR gate and for inverting said output to produce an inverted output, said inverted output being input to said fourth NAND gate and to said second NAND gate.

15. A circuit according to claim 14, wherein said first logic device comprises a fifth NAND gate for receiving an output from said third NAND gate and an output from said first NAND gate and for issuing an output pulse.

16. A circuit according to claim 15, further comprising an inverter for receiving said input signal and inverting said input signal to produce an inverted input signal, said inverted input signal being provided to said third NAND gate.

17. A circuit according to claim 9, wherein said second logic device includes means for resetting said first and second latches, said means for resetting comprising means for issuing a self-timed reset signal from an output side of said first and second latches.

18. An address transition circuit for detecting an input signal, the circuit having first and second nodes, comprising:
- a first R-S latch having its set input coupled to the first node, for detecting first transitions at the first node;
- a second R-S latch having its set input coupled to the first node, for detecting second transitions at the first node;
- first means, responsive to a first output of both the first and second R-S latches, for detecting that an input signal has been received at both the first and second R-S latches; and
- second means, responsive to an output of said first means, for resetting both the first and second R-S latches.

19. A circuit according to claim 18, wherein said first node comprises an input node and said second node comprises an output node.

20. A circuit according to claim 19, wherein said first means comprises a NAND gate for receiving an output from second latch and an output from said first latch and for issuing an output pulse, and wherein said second means comprises a first inverter for receiving the output pulse from said NAND gate, and for inverting said output thereof to produce an inverted output, and a second inverter for receiving the inverted output and for inverting said inverted output to provide a second inverted output, said second inverted output being input to said first latch and said second latch gate, said circuit further comprising a third inverter for receiving said input signal and inverting said input signal to produce an inverted input signal, said inverted input signal being provided to said second latch, and wherein said second means resets said first and second latches by issuing a self-timed reset signal from an output side of said first and second latches.

\* \* \* \* \*